United States Patent
Roberts et al.

(10) Patent No.: US 7,375,002 B2
(45) Date of Patent: May 20, 2008

(54) MIM CAPACITOR IN A SEMICONDUCTOR DEVICE AND METHOD THEREFOR

(75) Inventors: Douglas R. Roberts, Austin, TX (US); Gary L. Huffman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 374 days.

(21) Appl. No.: 11/168,579

(22) Filed: Jun. 28, 2005

(65) Prior Publication Data

US 2006/0292815 A1    Dec. 28, 2006

(51) Int. Cl.
    *H01L 21/20* (2006.01)
(52) U.S. Cl. .............. 438/396; 438/381; 257/E21.016
(58) Field of Classification Search ............. 438/381, 438/396; 257/E29.343, E21.008, E21.016
    See application file for complete search history.

(56) References Cited

U.S. PATENT DOCUMENTS

| | | | |
|---|---|---|---|
| 5,973,910 A | 10/1999 | Gardner | |
| 6,191,479 B1 | 2/2001 | Herrell et al. | |
| 6,285,050 B1 | 9/2001 | Emma et al. | |
| 6,303,457 B1 | 10/2001 | Christensen et al. | |
| 6,365,419 B1 | 4/2002 | Durlam et al. | |
| 6,630,380 B1 * | 10/2003 | Cheng et al. | 438/253 |
| 6,737,728 B1 | 5/2004 | Block et al. | |
| 6,743,642 B2 | 6/2004 | Costrini et al. | |
| 2005/0082592 A1 * | 4/2005 | Chang et al. | 257/306 |

OTHER PUBLICATIONS

Armacost et al, "A High Reliability Metal Insulator Metal Capacitor for 0.18 μm Copper Technology" 2000, IEEE.

* cited by examiner

*Primary Examiner*—Bradley K Smith
(74) *Attorney, Agent, or Firm*—Daniel D. Hill (57) ABSTRACT

A MIM capacitor is formed over one or more metal interconnect layers in a semiconductor device. The capacitor has a lower plate electrode and an upper plate electrode. An insulator is formed between the plate electrodes. Prior to forming the first plate electrode a first insulating layer is deposited over the metal of an interconnect layer. The first insulating layer is planarized using a chemical mechanical polish (CMP) process. A second insulating layer is then deposited over the planarized first insulating layer. The first plate electrode is formed over the second insulating layer. An insulator is formed over the first plate electrode and functions as the capacitor dielectric. A second plate electrode is formed over the insulator. Planarizing the first insulating layer and depositing a second insulating layer over the first insulating layer, reduces defects and produces a more reliable capacitor.

15 Claims, 6 Drawing Sheets

MIM CAPACITOR IN A SEMICONDUCTOR DEVICE AND METHOD THEREFOR

FIELD OF THE INVENTION

This invention relates, generally, to the field of semiconductor devices and more particularly to metal-insulator-metal (MIM) capacitors in semiconductor devices.

BACKGROUND OF THE INVENTION

One type of capacitor used in integrated circuits is a planar metal-insulator-metal (MIM) capacitor. A planar MIM capacitor includes a MIM dielectric between a top plate electrode and a bottom plate electrode. MIM capacitors are commonly used in decoupling and bypass applications.

Generally, a planar MIM capacitor may be unreliable and subject to premature breakdown when integrated over copper using a typical backend damascene process integration because of defects in the inter-level dielectric (ILD) between the copper and the planar MIM capacitor. Defects arising from, for example, topography, roughness, grain instability, and oxidation of the copper have all been variably identified as causes of the reliability failures. To avoid such issues, the MIM layout has been excluded from directly overlaying copper structures. Unfortunately, this can be a severe penalty against available on-chip MIM area; thus limiting the capacitance which can be created for decoupling and bypass applications. Thus, a need exists to control defects in a MIM capacitor when formed over copper.

BRIEF DESCRIPTION OF THE DRAWINGS

The present invention is illustrated by way of example and not by limitation in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally, the present invention provides, a method for forming a semiconductor device having a planar MIM capacitor. The planar MIM capacitor is formed over one or more metal interconnect layers. Each of the metal interconnect layers is isolated by an inter-level dielectric (ILD) layer. The capacitor has a bottom plate electrode and a top plate electrode. An insulator is formed between the plate electrodes. Prior to forming the first plate electrode a first insulating layer is deposited over the metal of an interconnect layer. The first insulating layer is planarized using a chemical mechanical polish (CMP) process in order to remove a portion of defects such as those transferred from the underlying metal. A second insulating layer is then deposited over the planarized first insulating layer to remove an additional portion of defects such as smaller defects caused by the CMP process. The bottom plate electrode is formed over the second insulating layer. An insulator which functions as the capacitor dielectric is formed over the bottom plate electrode. Finally a top plate electrode is formed over the insulator.

By planarizing the first insulating layer and depositing a second insulating layer over the first insulating layer, a surface with substantially fewer defects is formed over metal than exists in current practice. Thus, the planar MIM capacitor has reduced premature insulator breakdown due to defects and is therefore more reliable.

FIGS. 1-8 illustrate a portion of a semiconductor device 10 as it undergoes a series of processing steps to form a planar MIM capacitor in accordance with the present invention.

Figure 1:
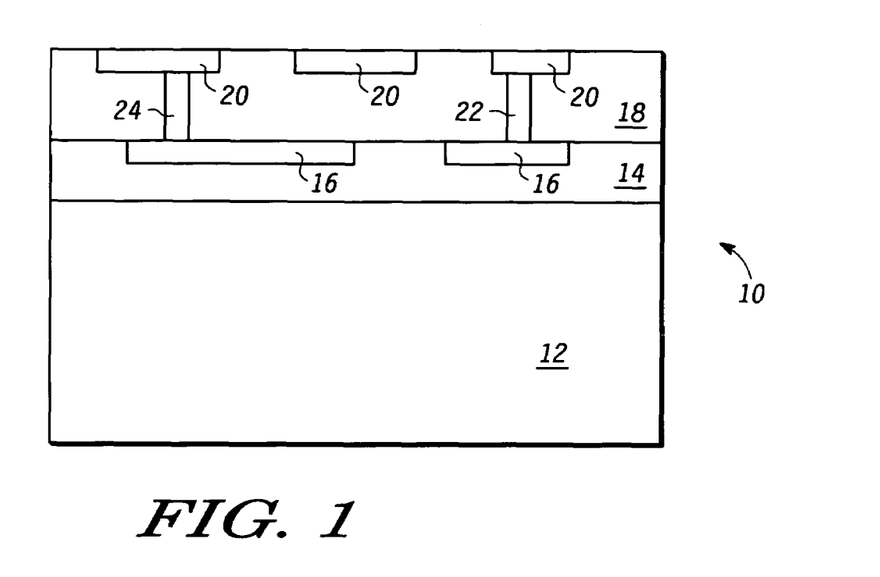
FIG. 1 illustrates a cross section of a portion of a semiconductor device that can be used to form a MIM capacitor in accordance with one embodiment of the present invention.

FIG. 1 illustrates a cross section of a portion of a semiconductor device 10 that can be used to form a planar MIM capacitor. A semiconductor substrate 12 is provided. In a preferred embodiment, semiconductor substrate 12 is silicon. However, other semiconductor materials can be used such as gallium arsenide and silicon-on-insulator (SOI). Typically, substrate 12 will include a number and variety of active and passive semiconductor devices, such as metal-oxide semiconductor (MOS) transistors, bipolar transistors, resistors, and capacitors. However, for purposes of understanding the present invention, an understanding of these devices is not necessary and thus these devices are not illustrated. A number of interconnect layers may be formed over the semiconductor substrate 12 and contacted to the active circuitry. Generally, depending on the complexity of the integrated circuit, there may be as few as one interconnect layer or more than nine. Each of the interconnect layers includes a plurality of metal conductors separated by an ILD layer. Two interconnect layers are illustrated in FIG. 1.

An ILD layer 14 is deposited on the semiconductor substrate 12. The ILD layer 14 can be any combination of layers of dielectric material formed by any process. For example, it may be silicon dioxide (SiO2), carbon-doped silicon oxide (e.g. SiCOH), tetraethyl orthosilicate (TEOS), boron/phosphorus doped TEOS (BPTEOS), silicon rich oxynitride (SRON), plasma-enhanced nitride (PEN), phosphosilicate glass (PSG), silicon carbon nitride (SiCN), or silicon rich oxide (SRO). Preferably, the ILD layer 14 is deposited to a thickness of between about 4000 to 10,000 Angstroms using plasma enhanced chemical vapor deposition (PECVD). A first conductive layer 16 is formed over the ILD 14 using physical vapor deposition (PVD), chemical vapor deposition (CVD), atomic layer deposition (ALD), electroplating, the like, and combinations of the above. In a preferred embodiment a first conductive layer 16 is predominately copper. However, in other embodiments, the first conductive layer 16 can be aluminum or an aluminum-copper alloy. Also, the first conductive layer 16 may be formed of multiple layers of materials. For instance in copper inlaid metallization schemes, diffusion barriers comprising tantalum or tantalum nitride are often formed prior to forming a copper layer.

A second ILD layer 18 is formed on the conductive layer 16 followed by a second conductive layer 20 using the same materials as described above for the first ILD layer 14 and the first conductive layer 16. In the illustrated embodiment two interconnect layers are illustrated. In other embodiments, there may be as few as one interconnect layer or more than nine interconnect layers. The conductors of the interconnect layers are connected to each other and to the circuits on the substrate 12 as needed using contacts formed through vias, such as contacts 22 and 24.

Figure 2:
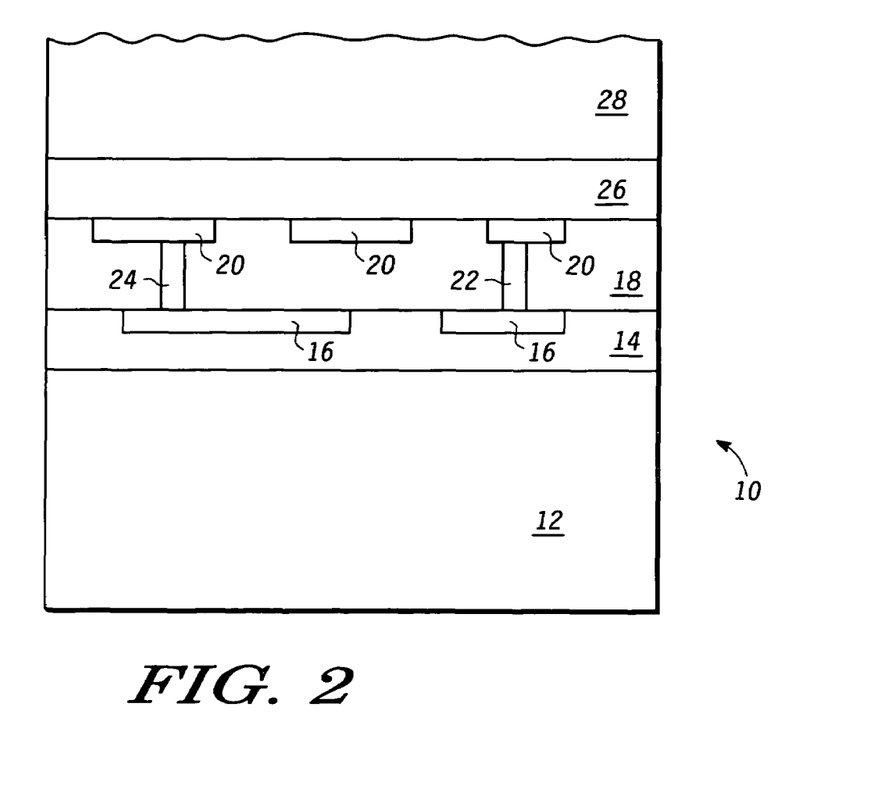
FIG. 2 illustrates the device of FIG. 1 after forming a barrier layer and a first insulating layer.

FIG. 2 illustrates the device of FIG. 1 after forming a barrier layer 26 and an insulating layer 28. The barrier layer 26 functions as a diffusion barrier to copper in the later formed layers. In the illustrated embodiment, the barrier layer 26 is PEN or SICN deposited to a thickness of about 300 to 500 angstroms. An insulating layer 28 is then deposited over the barrier layer 26 to a thickness of between about 3000 to 6000 Angstroms using a dielectric capping film such as TEOS, fluorinated TEOS (FTEOS), or SICOH. The deposition of layers 26 and 28 can transfer defects from the copper in second conductive layer 20 as well as create additional defects. Also, the surface of the insulating layer 28 can be relatively rough as illustrated in FIG. 2. The illustrated embodiment reduces the surface defects and smoothes the roughness of insulating layer 28 by planarization using a CMP process during wafer processing. A preferred CMP process is conventional, uses a relatively hard pad, and typical flow rates of a fumed silica dispersed abrasive slurry. Also, de-ionized water is used to rinse the wafer, followed by a typical post-polish ammonia hydroxide mechanical scrub. In other embodiments, a different CMP process may be used.

Figure 3:
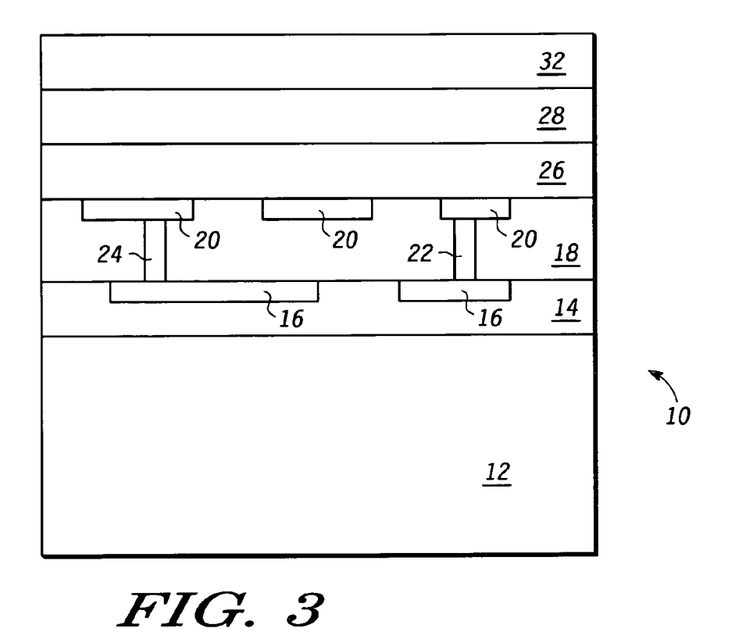
FIG. 3 illustrates the device of FIG. 2 after planarizing the first insulating layer and depositing a second insulating layer.

FIG. 3 illustrates the device of FIG. 2 after planarizing the insulating layer 28. The planarized insulating layer 28 may have a thickness of up to about 3000 Angstroms. Note that in some embodiments substantially all of the insulating layer 28 may be removed during the CMP process. After the CMP step, a second insulating layer 32 is deposited. The insulating layer 32 is a dielectric capping film such as TEOS, FTEOS, or SICOH deposited to a thickness of about 500 to 3000 Angstroms. The insulating layer 32 further reduces defects remaining after the CMP.

Figure 4:
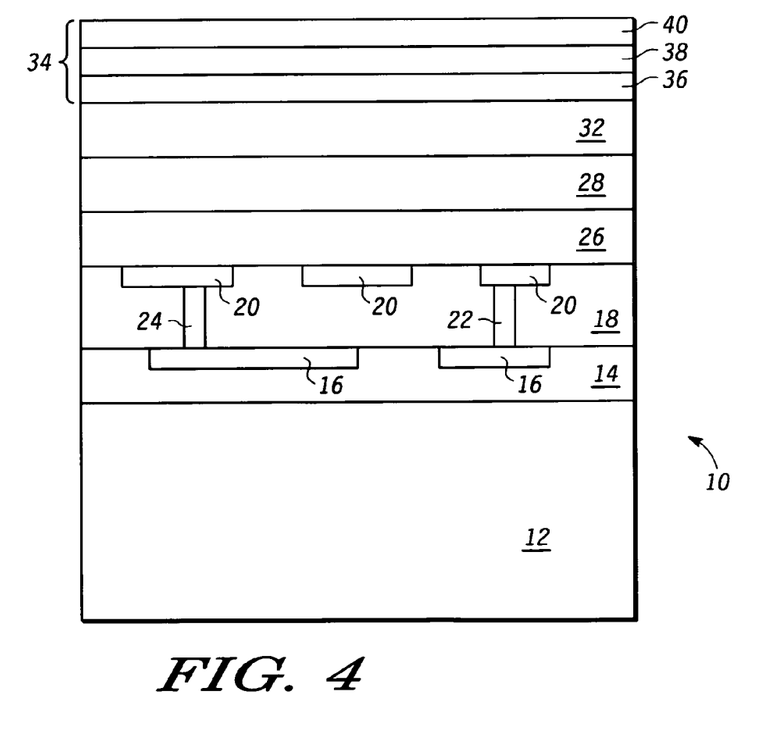
FIG. 4 illustrates the device of FIG. 3 after a MIM stack is formed.

FIG. 4 illustrates the device of FIG. 3 after a MIM stack 34 is formed on the insulating layer 32. MIM stack 34 includes bottom plate electrode layer 36, insulator 38 and top plate electrode layer 40. The bottom plate electrode layer 36 is formed from one of tantalum nitride (TaN), titanium nitride (TiN), aluminum (Al), copper (Cu), Ruthenium (Ru), Iridium (Ir), or the like. In one embodiment, the bottom plate electrode layer 36 is approximately 100 to 1000 Angstroms thick. The insulator 38 is formed on the bottom plate electrode layer 36 using CVD, PVD, ALD, the like or combinations of the above. In one embodiment, the insulator 38 comprises a metal oxide which has high linearity (e.g., a normalized capacitance variation of typically less than 100 parts per million units of voltage), such as tantalum oxide and hafnium oxide. However, for general applications in which linearity may be less critical, other metal oxides such as zirconium oxide, barium strontium titanate (BST), and strontium titanate (STO) may be suitable. Alternatively, an insulator 38 that is not a high dielectric constant material can be used, such as silicon dioxide. As used herein a high dielectric constant material is a material with a dielectric constant greater than that of silicon dioxide. The insulator 38 may also be plasma-enhanced nitride (PEN), which is $Si_xN_y$. The top plate electrode layer 40 is formed on the insulator 38 and may have the same composition and thickness as the bottom plate electrode layer 36.

Figure 5:
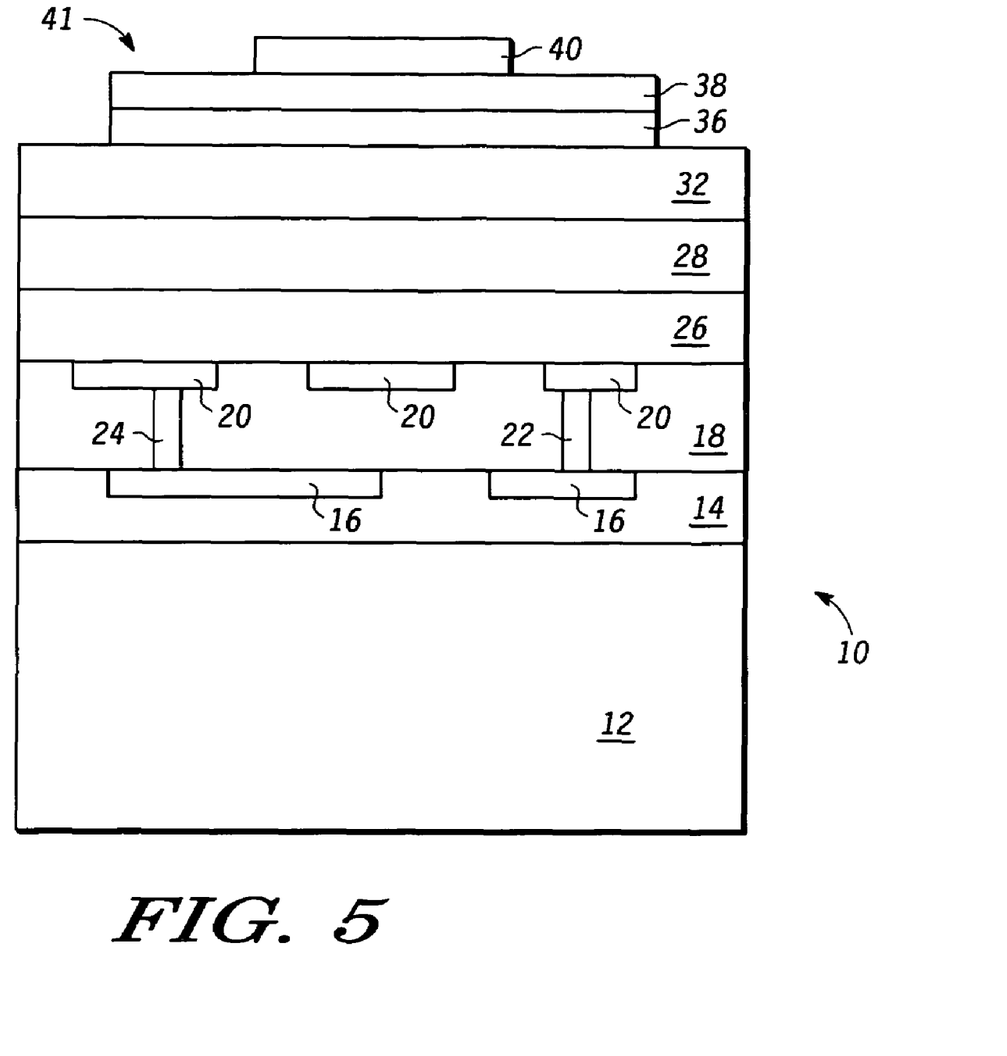
FIG. 5 illustrates the device of FIG. 4 after the MIM stack is patterned to form a MIM capacitor.

FIG. 5 illustrates the device of FIG. 4 after the MIM stack 34 is patterned to form a planar MIM capacitor 41. A photoresist layer (not shown) is deposited and patterned in order to subsequently etch the top plate electrode layer 40 to the desired size and shape. The bottom plate electrode layer 36 and insulator 38 are then patterned using another photoresist layer (not shown) as is known in the industry resulting in the planar MIM capacitor 41 illustrated in FIG. 5.

Figure 6:
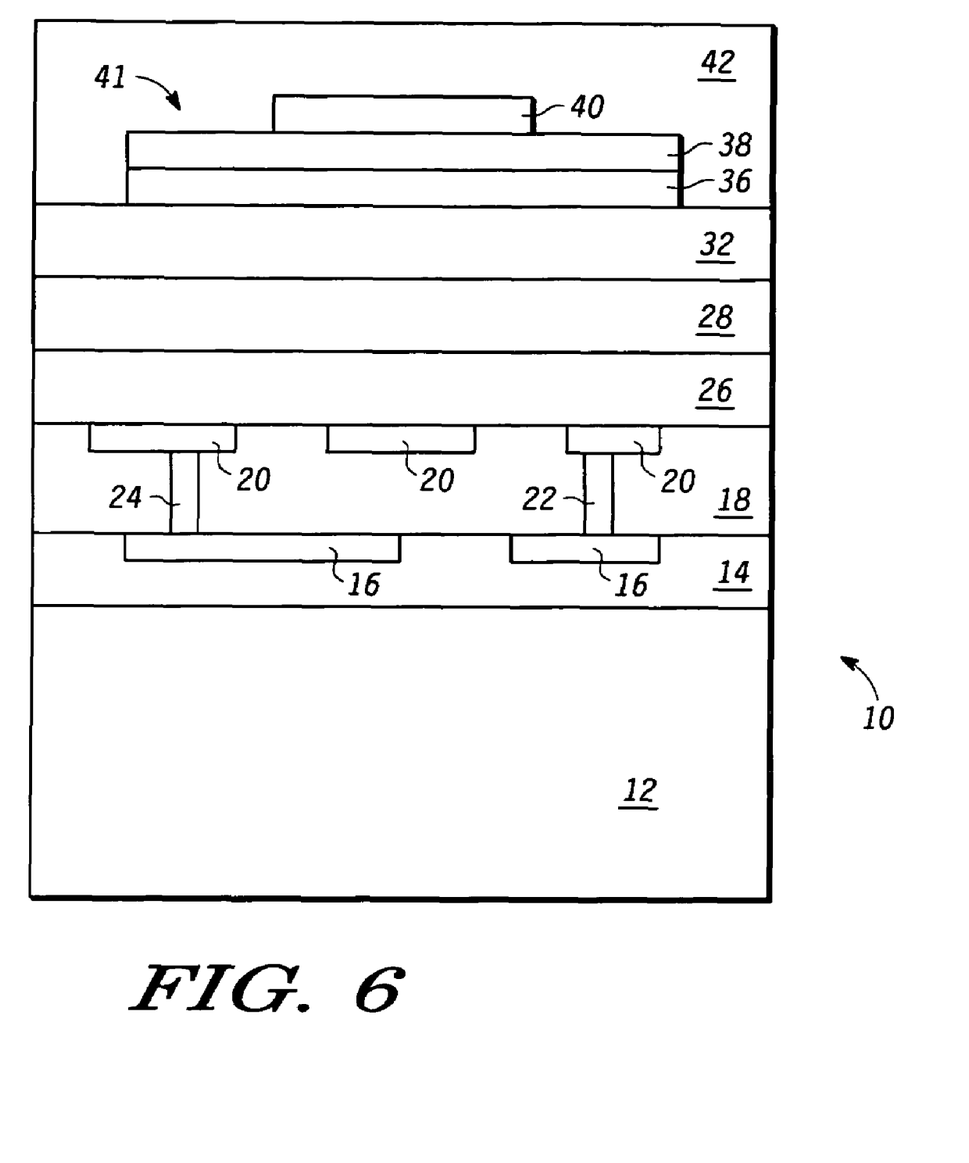
FIG. 6 illustrates the device of FIG. 5 after an insulating layer is formed over the MIM capacitor.

FIG. 6 illustrates the device of FIG. 5 after an insulating layer 42 is formed over the MIM capacitor. The insulating layer 42 is an ILD deposited over the semiconductor device 10. The insulating layer 42 can be any dielectric material such as TEOS, FTEOS, SICOH, or the like. The insulating layer may be approximately 100 to 1000 Angstroms thick. Subsequent metal interconnect layers may be formed over the insulating layer 42 if necessary.

Figure 7:
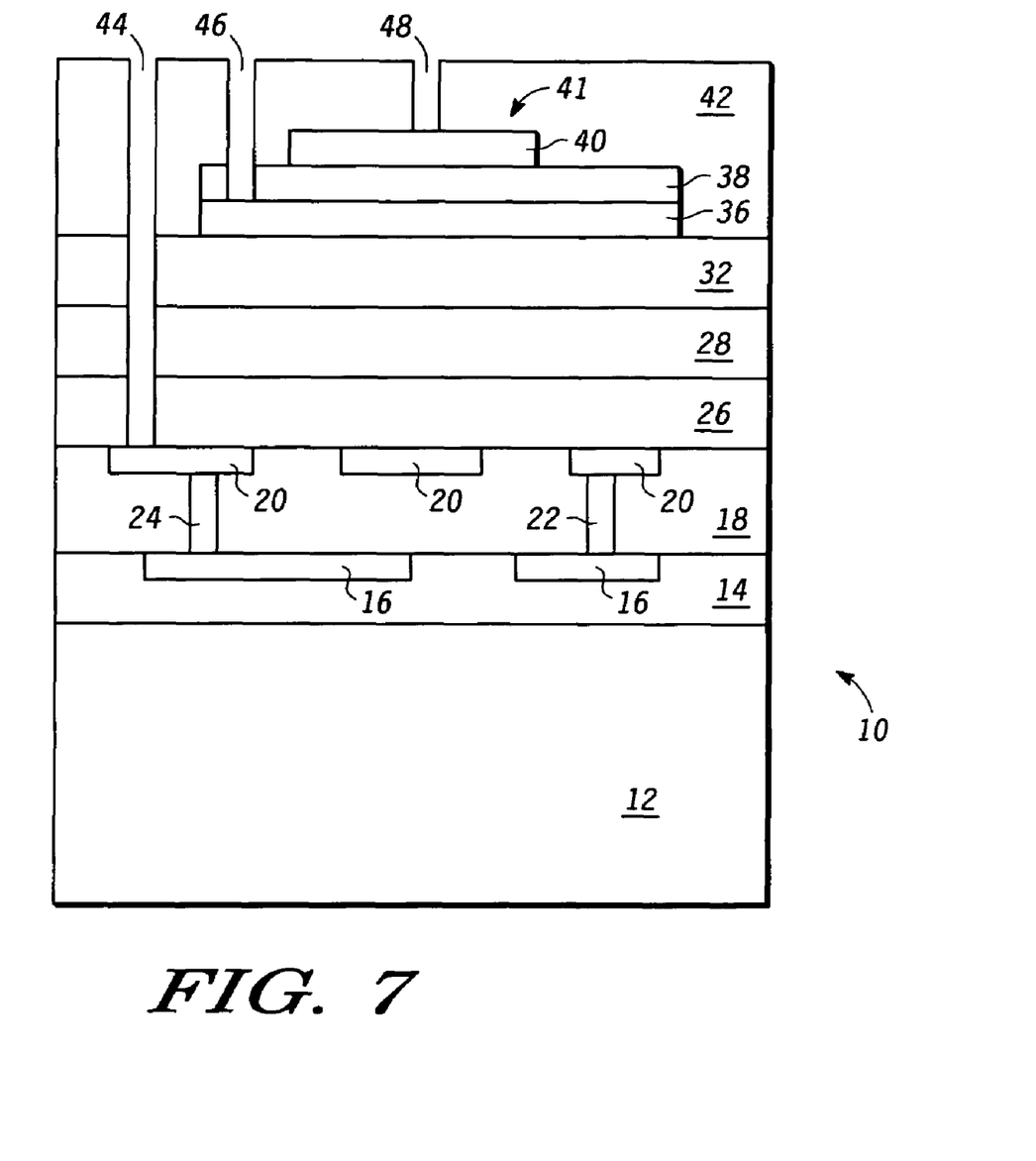
FIG. 7 illustrates the device of FIG. 6 after vias are formed in the insulating layer.

FIG. 7 illustrates the device of FIG. 6 after vias 44, 46, and 48 are formed in the insulating layer 42. A photoresist layer (not shown) is deposited and patterned to etch the insulator 42 to form via openings 44, 46, and 48. The chemistry of the via etch is conventional and is selective for etch stop onto the plate electrodes and onto the conductor in the interconnect layer 20.

Figure 8:
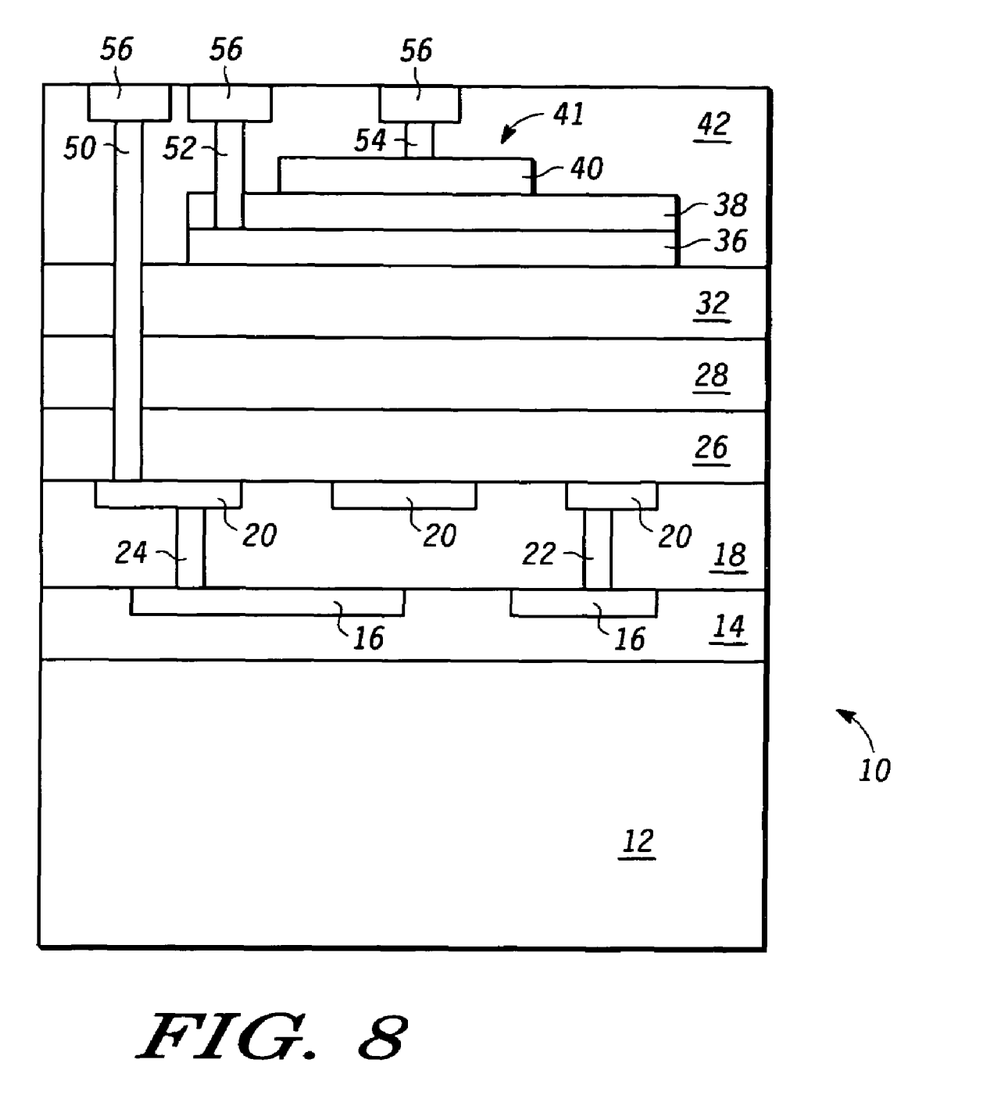
FIG. 8 illustrates the device of FIG. 7 after contacts are formed in the vias and a top interconnect layer is formed.

FIG. 8 illustrates the device of FIG. 7 after contacts 50, 52, and 54 are formed in the vias and a final interconnect layer 56 is formed. After the via openings are formed, they are filled with a conductive material to form the contacts 50, 52, and 54. Note that the contacts 50, 52, and 54 are representative of the many contacts formed in the semiconductor device 10. Contact 50 illustrates an electrical connection between a conductor of the final interconnect 56 and a conductor in the interconnect layer 20. Contact 52 illustrates an electrical connection between a conductor in interconnect layer 56 and the bottom plate electrode 36. Likewise, contact 54 illustrates an electrical connection between a conductor in the interconnect layer 56 and the top plate electrode 40. Note that in one application, the planar MIM capacitor 41 functions as a decoupling capacitor. In this case, the interconnect layer 56 may be used for routing a power supply voltage or ground. Also, the contacts for the top and bottom plate electrodes are usually coupled to the same interconnect layer.

Generally, in a planar MIM capacitor, the top plate electrode is smaller than bottom plate electrode. Therefore, the top plate electrode defines an active area for the capacitor, which should be as defect free as possible for high reliability. However, for relatively large planar MIM capacitors, the top and bottom plate electrodes are of similar size.

In accordance with the illustrated embodiment, large area planar MIM capacitors of approximately one square centimeter or more can be formed on an integrated circuit (IC). In one embodiment, the planar MIM capacitor may cover 50 percent or more of the integrated circuit, and in another embodiment, substantially the entire surface of the integrated circuit. Also, the planar MIM capacitor can have a relatively high capacitance density of more than 10 $fF/\mu m^2$ using low, medium, or high K insulators deposited by conventional methods such as ALD, CVD, PVD, and the like.

The embodiment described as shown in the figures is a planar MIM capacitor formed just below the final interconnect layer. However, those skilled in the art will realize that the planar MIM capacitor may be formed anywhere above the substrate 12. For example, the planar MIM capacitor may be formed below the first interconnect layer, above the final interconnect layer, or anywhere in between. There are related structures, not explicitly shown in the figures, which are generally always present on-chip as essential parts of the IC interconnect circuitry.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In the foregoing specification, the invention has been described with reference to specific embodiments. However, one of ordinary skill in the art appreciates that various modifications and changes can be made without departing from the scope of the present invention as set forth in the claims below. For example, the MIM capacitor could be formed using a damascene integration. Accordingly, the specification and figures are to be regarded in an illustrative rather than a restrictive sense, and all such modifications are intended to be included within the scope of present invention.

What is claimed is:

1. A method for forming a semiconductor device having a planar metal-insulator-metal (MIM) capacitor comprising:
providing a semiconductor substrate;
forming a plurality of layers of copper conductors over the semiconductor substrate, wherein a layer of the plurality of layers of copper conductors are formed over another layer of the plurality of layers of copper conductors, and each layer being separated from the semiconductor substrate and other layers of the plurality of layers of copper conductors by a plurality of inter-level dielectric layers;
forming a first insulating layer over the plurality of layers of copper conductors;
planarizing the first insulating layer;
forming a second insulating layer over the first insulating layer;
forming a first plate electrode for the planar MIM capacitor over the second insulating layer and directly over more than one conductor of each of the plurality of layers of copper conductors;
forming a third insulating layer over the first electrode; and
forming a second plate electrode for the planar MIM capacitor over the third insulating layer.

2. The method of claim 1, wherein planarizing the first insulating layer comprises planarizing the first insulating layer using a chemical mechanical polishing process.

3. The method of claim 1, further comprising:
forming a fourth insulating layer over the second plate electrode;
forming a plurality of conductors over the fourth insulating layer; and
electrically coupling the second plate electrode to one of the plurality of conductors.

4. The method of claim 1, wherein the first insulating layer comprises tetraethyl orthosilicate (TEOS).

5. The method of claim 1, wherein the third insulating layer comprises a high K dielectric formed to be between 20 to 1000 angstroms thick.

6. The method of claim 1, wherein the MIM capacitor functions as a decoupling capacitor for the semiconductor device.

7. The method of claim 1, wherein the MIM capacitor covers at least 50 percent of a surface area of the semiconductor device.

8. A method for forming a semiconductor device having a metal-insulator-metal (MIM) capacitor comprising:
providing a semiconductor substrate;
forming a plurality of copper interconnect layers over the semiconductor substrate, wherein each layer of the plurality of copper interconnect layers comprises a plurality of conductors and each layer of the plurality of copper interconnect layers is separated by a plurality of inter-level dielectric layers;
forming a first insulating layer over the plurality of copper interconnect layers;
planarizing the first insulating layer;
forming a second insulating layer over the first insulating layer;
forming a first plate electrode of the MIM capacitor over the second insulating layer and directly over more than one conductor of each of the plurality of copper interconnect layers;
forming a third insulating layer over the first electrode;
forming a second plate electrode of the MIM capacitor over the third insulating layer
forming a fourth insulating layer over the second plate electrode;
forming a plurality of conductors over the fourth insulating layer; and
electrically coupling the second plate electrode to one of the plurality of conductors.

9. The method of claim 8, wherein planarizing the first insulating layer comprises planarizing the first insulating layer using a chemical mechanical polishing process.

10. The method of claim 8, wherein the MIM capacitor functions as a decoupling capacitor for the semiconductor device.

11. The method of claim 8, wherein the first insulating layer comprises tetraethyl orthosilicate (TEOS).

12. The method of claim 8, wherein the third insulating layer comprises a high K dielectric formed to be between 20 to 1000 angstroms thick.

13. The method of claim 8, wherein the MIM capacitor covers at least 50 percent of a surface area of the semiconductor device.

14. A semiconductor device comprising:
a semiconductor substrate;
a first inter-level dielectric layer formed over the semiconductor substrate;
a first interconnect layer comprising a first plurality of copper conductors formed over the first inter-level dielectric layer;
a second inter-level dielectric layer formed over the first copper interconnect layer;
a second interconnect layer comprising a second plurality of copper conductors formed over the second inter-level dielectric layer;
a first planarized insulating layer formed over the second interconnect layer;
a second insulating layer formed over the first insulating layer;

a first plate electrode formed over the second insulating layer and directly over at least two conductors of each of the first and second plurality of conductors;
a third insulating layer formed over the first electrode; and
a second plate electrode formed over the third insulating layer.

15. The semiconductor device of claim 14, wherein the first planarized insulating layer is planarized using a chemical mechanical polishing process.

* * * * *